(12) United States Patent
Kim et al.

(10) Patent No.: US 8,092,870 B2
(45) Date of Patent: Jan. 10, 2012

(54) PREPARATION OF METAL OXIDE THIN FILM VIA CYCLIC CVD OR ALD

(75) Inventors: Moo-Sung Kim, Sungnam (KR); Xinjian Lei, Vista, CA (US); Daniel P. Spence, San Diego, CA (US); Sang-Hyun Yang, Suwon (KR)

(73) Assignee: Air Products and Chemicals, Inc., Allentown, PA (US)

(*) Notice: Subject to any disclaimer, the term of this patent is extended or adjusted under 35 U.S.C. 154(b) by 422 days.

(21) Appl. No.: 12/410,529

(22) Filed: Mar. 25, 2009

(65) Prior Publication Data

US 2010/0075067 A1    Mar. 25, 2010

Related U.S. Application Data

(60) Provisional application No. 61/044,270, filed on Apr. 11, 2008.

(51) Int. Cl.
*H05H 1/24* (2006.01)
*C23C 16/00* (2006.01)

(52) U.S. Cl. .................. 427/576; 427/569; 427/248.1

(58) Field of Classification Search .......... 427/576, 427/569, 248.1
See application file for complete search history.

(56) References Cited

U.S. PATENT DOCUMENTS

| | | | |
|---|---|---|---|
| 5,820,664 A | 10/1998 | Gardiner et al. | |
| 6,689,427 B2 | 2/2004 | Min et al. | |
| 6,752,869 B2 | 6/2004 | Lee et al. | |
| 7,132,556 B2 | 11/2006 | Benvenuti et al. | |
| 7,755,128 B2* | 7/2010 | Clark | 257/310 |
| 7,947,814 B2* | 5/2011 | Lei et al. | 534/15 |
| 2002/0058843 A1 | 5/2002 | Min et al. | |
| 2003/0012876 A1* | 1/2003 | Min et al. | 427/248.1 |
| 2007/0248754 A1 | 10/2007 | Lei | |

FOREIGN PATENT DOCUMENTS

| | | |
|---|---|---|
| EP | 1 849 789 A1 | 10/2007 |
| EP | 1 983 073 A1 | 10/2008 |
| EP | 2 065 364 A1 | 6/2009 |
| JP | 2002305194 | 10/2002 |
| KR | 20030000423 | 1/2003 |
| KR | 20070105280 | 10/2007 |

OTHER PUBLICATIONS

Jung-Hyun Lee et al, Chemical Vapor Deposition of Barium Strontium Titanate Thin Films by the Direct Liquid . . . , Electro. and Solid-State Letters, 2, 10, 1999, pp. 510-511.

J.H. Lee et al, Plasma enhanced atomic layer deposition of SrTiO3 thin films with . . . , J. Vac. Sci. Technol. A 20(5), 2002 pp. 1828-1830.

(Continued)

*Primary Examiner* — Kelly M Gambetta
(74) *Attorney, Agent, or Firm* — Joseph D. Rossi; Geoffrey L. Chase

(57) ABSTRACT

A cyclic deposition process to make a metal oxide film on a substrate, which comprises the steps: introducing a metal ketoiminate into a deposition chamber and depositing the metal ketoiminate on a heated substrate; purging the deposition chamber to remove unreacted metal ketominate and any byproduct; introducing an oxygen-containing source to the heated substrate; purging the deposition chamber to remove any unreacted chemical and byproduct; and, repeating the cyclic deposition process until a desired thickness of film is established.

31 Claims, 8 Drawing Sheets

OTHER PUBLICATIONS

Sang Woon Lee et al, SrTiO3 thin film growth by atomic layer deposition using Ti(O-iPr)2(thd)2 . . . , ECS Transactions, 6(3) 2007 pp. 87-97.

Sunkwon Lim et al, A study on the development of CVD precursors V—syntheses and characterization of . . . , J. Organometallic Chem. 686 (2004) pp. 224-237.

Simon Doherty et al, N-alkoxy-b-ketoiminate complexes of groups 4 and 5: synthesis and characterication of the complexes . . . , Organometallics, 1999, 18, pp. 1018-1029.

S. Ezhilvalavan et al, Progress in the developments of (Ba,Sr)TiO3 (BST) thin films for Gigabit era DRAMs, Mat. Chem. and Phys. 65 (2000) pp. 227-248.

Sung Ho Hong et al, Decomposition behaviors of bis(N-alkoxy-p-ketoiminate) titanium complexes in the depositions of titanium oxide and barium strontium titanate films, Thin Solid Films 409 (2002) pp. 82-87.

Ki-Chul Kim et al, Evaluation of novel Sr precursors for atomic layer depositions of SrOo thin film, ECS Transactions, 11 (7) 2007 pp. 131-136.

Oh Seong Kwon et al, Chemically conformal ALD of SrTiO3 thin films using conventional metallorganic precursors, J. Electro. Soc. 152 (4) 2005 pp. C229-C236.

Oh Seong Kwon et al, Atomic layer deposition and electrical properties of SrTiO3 thin films grown using . . . , J. Electro. Soc. 154 (6) 2007, pp. G127-G133.

Jung-Hyun Lee et al, Comparison of (Ba,Sr)TiO3 thin films from metallorganic chemical vapor deposition with . . . , Electro. Solid-State Letters, 2 (10) 1999 pp. 507-509.

Toshihiro Nakamura et al, Thermal decomposition mechanism of a titanium source, Ti(MPD)(METHD)2, in MOCVD, J. Electro. Soc. 151 (12) 2004, pp. C806-C810.

Yo-Sep Min et al, Liquid Source-MOCVD of BaxSr1-x TiO3 (BST) thin films with a n-alkoxy-b-ketoiminato titanium complex, Chem. Vap. Deposition 2001, 7, No. 4, pp. 146-149.

Marko Vehkamaki et al, Atomic layer deposition of SrTiO3 thin films from a novel strontium precursor-strontium-bis (tri-isopropylcyclopentadienyl), Chem. Vap. Deposition 2001, 7, No. 2, pp. 75-80.

Marko Vehkamaki et al, Growth of SrTiO3 and BaTiO3 thin films by atomic layer deposition, Electro. Solid-State Letters, 2 (10) 1999 pp. 504-506.

Holme, T.P., et al; "Atomic Layer Deposition and Chemical Vapor Deposition Precursor Selection Method Application to Strontium and Barium Precursors"; Journal of Physical Chemistry a American Chemical Society USA; vol. 111, No. 33; Aug. 23, 2007; pp. 8147-8151; XP002537255.

Vehkamaki M., et al; "Growth of SrTiO3 and BaTiO3 Thin Films by Atomic Layer Deposition"; Electrochemical and Solid-State LEtters Electrochem. Soc. USA; vol. 2, No. 10; Oct. 1999; pp. 504-506; XP002537256.

Hong, S.H., et al; "Decomposition Behaviors of Bis(N-alkoxy-p-ketoiminate) Titanium Complexes in the Depositions of Titanium Oxide and Barium Strontium Titanate Films"; Thin Solid Films, Elsevier-Sequoia S.A. Lausanne, CH; vol. 409, No. 1; Apr. 22, 2002; pp. 82-87; XP004355619.

Jones, et al; "Molecular Design of Improved Precursors for the MOCVD of Oxides Used in Microelectronics"; Surface and Coatings Technology, Elsevier, Amsterdam, NL; vol. 201, No. 22-23; Aug. 9, 2007; pp. 9046-9054; XP022191932.

Holme, T.P., et al; "Atomic Layer Deposition and Chemical Vapor Deposition Precursor Selection Method Application to Strontium and Barium Precursors"; Journal of Physical Chemistry A American Chemical Society USA; vol. 111, No. 33; pp. 8147-8151; Aug. 23, 2007; XP002537255.

Vehkamaki, M., et al; "Growth of SrTi03 and BaTi03 Thin Films by Atomic Layer Deposition"; Electrochemical and Solid-State Letters Electrochem. Soc USA; vol. 2, No. 10; pp. 504-506; Oct. 1999; XP002537256.

Hong, S.H., et al; "Decomposition Behaviors of bis(N-alkoxy-p-ketoiminate) Titanium Complexes in the Depositions of Titanium Oxide and Barium Strontium Titanate Films"; Thin Solid Films, Elsevier-Sequoia S.A. Lausanne, CH; vol. 409, No. 1; pp. 82-87; Apr. 22, 2002; XP004355619.

Jones, et al; "Molecular Design of Improved Precursors for the MOCVD of Oxides Used in Microelectronics"; Surface and Coatings Technology, Elseiver, Amsterdam, NL; vol. 201, No. 22-23; pp. 9046-9054; Aug. 9, 2007; XP022191932.

Lim, S., et al; "A Study on the Development of CVD Precursors V—Syntheses and Characterization of New N-alkoxy-beta-ketoiminate Complexes of Titanium"; Journal of Organometallic Chemistry, Elsevier-Sequoia S.A. Lausanne, CH; vol. 689, No. 1; pp. 224-237; Jan. 5, 2004; XP004482168.

Doherty, S., et al; "N-Alkoxy-beta-ketoiminate Complexes of Groups 4 and 5: Synthesis and Characterization of the complexes [ETA5-C5H4R)MAaCH3C(0)CHC(NCH2CHR'0)CH3uCLNu (M= TI, N=1; M=NB, N=2; R=H, ME;R'=, ME) [TIaCH3C(0)CHC(NCH2CHR'0)CH3uCL2(THF)], and [TIaCH3C(0)CHC(NCH2CHR'O) CH3u2]"; Organometallics, ACS, Washington, DC, US; vol. 18, No. 6; pp. 1018-1028; Jan. 1, 1999; XP002242466.

\* cited by examiner

PREPARATION OF METAL OXIDE THIN FILM VIA CYCLIC CVD OR ALD

CROSS REFERENCE TO RELATED APPLICATION

This patent application claims the benefit of U.S. Provisional Patent Application Ser. No. 61/044,270 filed 11 Apr. 2008.

BACKGROUND OF THE INVENTION

High-dielectric constant (high-k) thin films such as $SrTiO_3$ (STO) and $Ba(Sr)TiO_3$ (BST) have been widely investigated as one of the promising capacitor materials of the next generation dynamic random access memory (DRAM) devices. For this application, very conformal deposition with respect to the film thickness and composition is required over a 3-dimensional (3-D) capacitor structure.

Recently, atomic layer deposition (ALD) processes have been developed to meet these requirements using various source materials. ALD is one of the most promising techniques based upon its unique self-limiting deposition mechanism. In general, ALD can show low deposition temperature, excellent step coverage over high aspect ratio features, good thickness uniformity and accurate thickness control by means of layer-by-layer film deposition.

Plasma enhanced ALD (PEALD) has also been developed due to its advantages, such as higher deposition rate and lower deposition temperature, while keeping advantages of ALD.

Regarding precursor materials, for example, STO thin film can be deposited with Sr bis(2,2,6,6-tetramethyl-3,5-heptanedionato), i.e., $(Sr(thd)_2)$ as a Sr precursor, TTIP(Ti-tetraisopropoxide) as a Ti precursor and $O_3$, $O_2$ plasma or $H_2O$ vapor as an oxidant. Especially regarding Sr precursor, although $Sr(thd)_2$ and some other Sr precursors have been widely studied, those precursors still have limitations, such as too low vapor pressure, thermal decomposition at low temperature, etc.

Therefore, a demand still remains for developing an appropriate Group 2 or Group 4 precursor and corresponding deposition process, most importantly finding Group 2 and 4 complexes that have similar ligands, which make them compatible in terms of physical and chemical properties, such as melting point, solubility, vaporization behavior and reactivity towards a semi-fabricated semiconductor surface. Consequently, the Group 2 and 4 complexes can be dissolved in a solvent and delivered into a reaction chamber to deposit a multi-component metal oxide film for DRAM applications.

BRIEF SUMMARY OF THE INVENTION

The present invention is a cyclic deposition process to make a metal oxide film on a substrate, which comprises the steps: introducing a metal ketoiminate into a deposition chamber and depositing the metal ketoiminate on a heated substrate; purging the deposition chamber to remove unreacted metal ketominate and any by-products; introducing an oxygen-containing source to the heated substrate; purging the deposition chamber to remove any by-products; and, repeating the cyclic deposition process until a desired thickness of film is established.

DETAILED DESCRIPTION OF THE INVENTION

Figure 1:
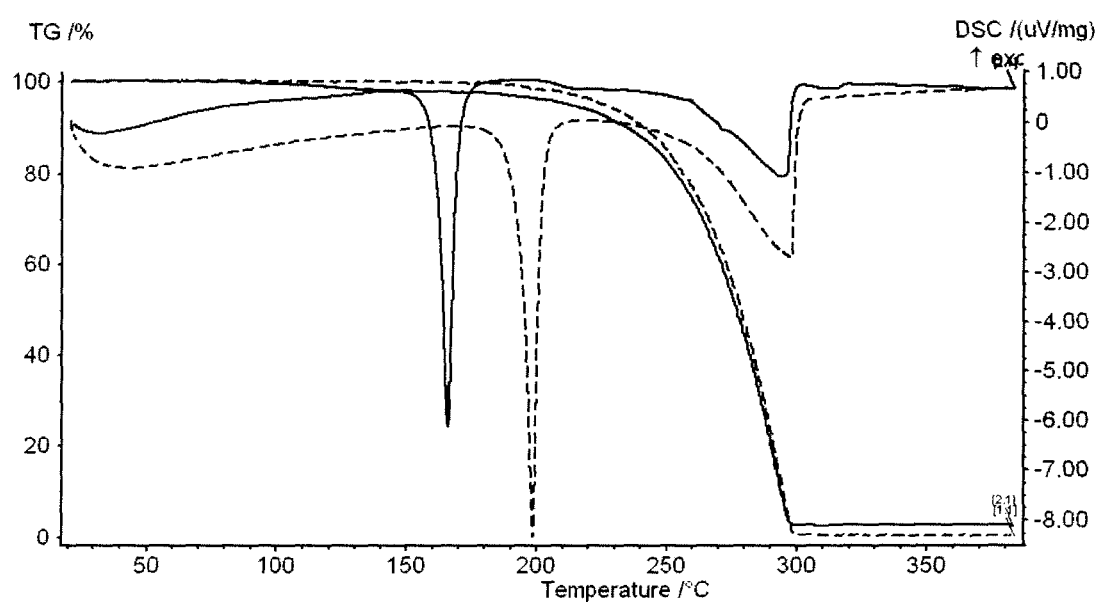
FIG. 1 is Thermo Gravimetric Analysis/Differential Scanning Calorimetry (TGA/DSC) graphs of $Sr\{^tBuC(O)CHC(NCH_2CH_2NMe_2)Me\}_2$ (solid line) and $Ti\{MeC(O)CHC(NCH_2CH_2O)Me\}_2$ (dotted line), indicating these two complexes are compatible due to their very similar vaporization behavior.
Figure 2:
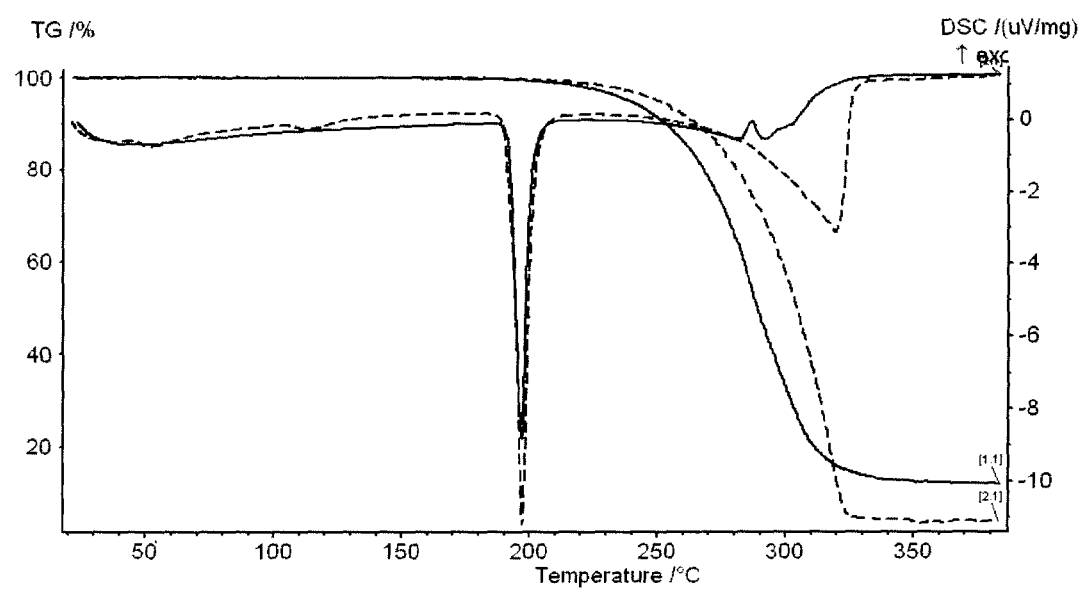
FIG. 2 is TGA/DSC graphs of $Sr\{^tBuC(O)CHC(NCH(Me)CH_2NMe2)Me\}_2$ (solid line) and $Ti\{MeC(O)CHC(NCH(Me)CH_2O)Me\}_2$ (dotted line), demonstrating these two complexes are compatible due to their same melting point, as well as similar vaporization behavior.

The invention describes a method for making a metal or multicomponent metal oxide film, such as strontium oxide, titanium oxide or strontium titanate, which may be used, for example, in fabricating semiconductor devices. The method disclosed herein provides a metal or multicomponent metal oxide film that has a dielectric constant substantially higher than that of either conventional thermal silicon oxide, silicon nitride, or zirconium/hafnium oxide dielectric.

The method disclosed herein deposits the metal oxide films using cyclic chemical vapor deposition (CCVD) or atomic layer deposition (ALD) techniques. In certain embodiments, the metal oxide films are deposited via a plasma enhanced ALD (PEALD) or plasma enhanced CCVD (PECCVD) process. In this embodiment, the deposition temperature may be relatively low, such as 200 to 600° C., to control the specifications of film properties required in DRAM or other semiconductor applications. The method disclosed herein forms the metal oxide films using metal ketoiminate precursors and an oxygen source.

A typical process is described as follows:

Step 1. Contacting vapors of a metal ketoiminate precursor with a heated substrate to chemically sorb the precursor on the heated substrate;

Step 2. Purging away any unsorbed ketoiminate precursors and any by-products;

Step 3. Introducing an oxygen source on the heated substrate to react with the sorbed metal ketoiminate precursor; and, Step 4. Purging away any unreacted oxygen source and by-products.

In one embodiment, the ketoiminate precursor is selected from the group represented by the structure:

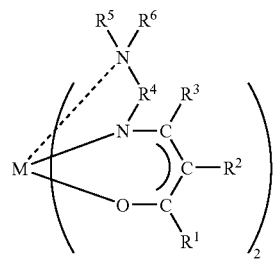

A wherein M is a divalent Group 2 metal including calcium, magnesium, strontium, barium. A variety of organo groups may be employed, as for example wherein $R^1$ is selected from the group consisting of alkyl, fluoroalkyl, cycloaliphatic, having from 1 to 10 carbon atoms, preferably a group containing 1 to 6 carbon atoms, and an aryl group having from 6 to 12 carbon atoms; $R^2$ is selected from the group consisting of hydrogen, alkyl, alkoxy, cycloaliphatic, having from 1 to 10 carbon atoms, preferably a group containing 1 to 6 carbon atoms, and an aryl group having from 6 to 12 carbon atoms; $R^3$ is selected from the group consisting of alkyl, fluoroalkyl, cycloaliphatic, having from 1 to 10 carbon atoms, preferably a group containing 1 to 6 carbon atoms, and an aryl group having from 6 to 12 carbon atoms; $R^4$ is a $C_{2-3}$ linear or branched alkyl bridge with or without chiral carbon atom, thus making a five- or six-membered coordinating ring to the metal center, Exemplary alkyl bridges include but are not limited to —(CH$_2$)$_2$—, —(CH$_2$)$_3$—, —CH(Me)CH$_2$—, —CH$_2$CH(Me)-; $R^{5-6}$ are individually selected from the group consisting of alkyl, fluoroalkyl, cycloaliphatic, having from 1 to 10 carbon atoms, preferably a group containing 1 to 6 carbon atoms, and an aryl group having from 6 to 12 carbon atoms, and they can be connected to form a ring containing carbon, oxygen, or nitrogen atoms. The structure A metal ketoiminate preferably is selected from the group consisting of Sr{$^t$BuC(O)CHC(NCH$_2$CH$_2$NMe$_2$)Me}$_2$, Sr{$^t$BuC(O)CHC(NCH$_2$CH$_2$NEt$_2$)Me}$_2$, Sr{$^t$BuC(O)CHC(NCH(Me)CH$_2$NMe$_2$)Me}$_2$, and Sr{$^t$BuC(O)CHC(NCH(Me)CH$_2$NEt$_2$)Me}$_2$.

In another embodiment, a ketoiminate precursor is selected from the group represented by the structure:

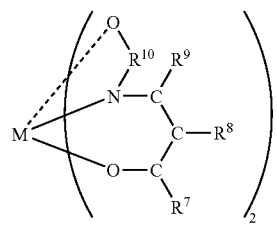

B wherein M is a tetra-valent Group 4 metals, including titanium, zirconium, or hafnium. A variety of organo groups may be employed as for example wherein $R^7$ is selected from the group consisting of alkyl, fluoroalkyl, cycloaliphatic, having from 1 to 10 carbon atoms, preferably a group containing 1 to 6 carbon atoms, and an aryl group having from 6 to 12 carbon atoms; $R^{8-9}$ is selected from the group consisting of hydrogen, alkyl, alkoxy, cycloaliphatic, having from 1 to 10 carbon atoms, preferably a group containing 1 to 6 carbon atoms, and an aryl group having from 6 to 12 carbon atoms; $R^{19}$ is a $C_{2-3}$ linear or branched alkyl bridge with or without chiral carbon atom, thus making a five- or six-membered coordinating ring to the metal center. Exemplary alkyl bridges, include, but are not limited to: —(CH$_2$)$_2$—, —(CH$_2$)$_3$—, —CH(Me)CH$_2$—, —CH$_2$CH(Me)-.

The deposition methods disclosed herein may involve one or more purge gases. The purge gas, used in the steps of purging away unreacted reactant and/or by-products, is an inert gas that does not react with the precursors and may preferably be selected from the group consisting of Ar, N$_2$, He, and mixture thereof. Depending upon the deposition method, the purge gas, such as Ar, is supplied into the reactor, e.g., at a flow rate of about 10 to 2000 sccm for about 0.1 to 1000 seconds, thereby purging the unreacted material and any byproduct that remain in the chamber.

The temperature of the substrate in the reactor, i.e., a deposition chamber, may preferably be below about 600° C. and more preferably below about 500° C., and the process pressure may preferably be from about 0.01 Torr to about 100 Torr, and more preferably from about 0.1 Torr to about 5 Torr.

The oxygen source in Step 3 can be an oxygen-containing source selected from the group consisting of oxygen, oxygen plasma, water, water plasma, ozone, nitrous oxide and mixture thereof.

The respective step of supplying the precursors and the oxygen source gases may be performed by varying the duration of the time for supplying them to change the stoichiometric composition of the resulting metal oxide film. For multicomponent metal oxide films, a ketominate precursor selected from the structures "A" or "B" can be alternately introduced in step 1 into the reactor chamber.

A direct liquid delivery method can be employed by dissolving the ketoiminate in a suitable solvent or a solvent mixture to prepare a solution with a molar concentration from 0.01 to 2 M, depending the solvent or mixed-solvents employed. The solvent employed in the invention may comprise any compatible solvents or their mixture including aliphatic hydrocarbons, aromatic hydrocarbons, linear or cyclic ethers, esters, nitriles, alcohols, amines, polyamines, and organic amides, preferably a solvent with high boiling point, such as mesitylene (b.p. 164° C.) or N-methyl-2-pyrrolidinone (b.p. 202° C.) and more preferably a solvent mixture consisting of a polar solvent such as tetrahydrofuran (THF) or N-methylpyrrolidinone (NMP) and a non-polar solvent, such as dodecane.

The plasma-generated process comprises a direct plasma-generated process in which plasma is directly generated in the reactor, or a remote plasma-generated process in which plasma is generated out of the reactor and supplied into the reactor.

The present invention also contemplates a cyclic deposition process for the formation of ternary metal oxide films wherein a plurality of precursors are sequentially introduced into a deposition chamber, vaporized and deposited on a substrate under conditions for forming a said ternary metal oxide film.

The present invention further contemplates that the resulting metal oxide films can be exposed to a plasma treatment to densify the resulting multicomponent metal oxide film.

The present invention is useful as a method for deposition of metal oxide or multiple component metal oxide thin films, which are utilized in a semiconductor device structures. With this invention, a metal oxide film can be formed with an atomic layer deposition ALD or CCVD method, depending on the process condition.

An ALD growth proceeds by exposing the substrate surface alternatively to the different precursors. It differs from CVD by keeping the precursors strictly separated from each other in the gas phase. In an ideal ALD window where film growth proceeds by self-limiting control of surface reaction, the pulse length of each precursor, as well as the deposition temperature, have no effect on the growth rate, if the surface is saturated.

A CCVD process can be performed at a higher temperature range, than an ALD process, where in CCVD a precursor decomposes. CCVD is different from the traditional CVD in terms of precursor separation. Each precursor is sequentially introduced and totally separated in CCVD, but in traditional CVD, all reactant precursors are introduced to the reactor and induced to react with each other in the gas phase. The common attribute of CCVD and traditional CVD is that both relate to the thermal decomposition of precursors.

The present invention is also useful as a method of depositing metal oxide films using plasma-enhanced an ALD (PEALD) technique to make a semiconductor device structure. Metal oxide films can be prepared by a CVD and a typical thermal ALD; however, using PEALD, the deposition rate can be increased, and it is known that PEALD enhances the film properties and widens the process window.

EXAMPLE 1

This example describes a CCVD deposition of SrO using a Sr ketoiminate precursor, $Sr\{^tBuC(O)CHC(NCH_2CH_2NMe_2)Me\}_2$, dissolved in mesitylene, and $O_2$ plasma. The deposition temperature range is 200~400° C., and a DLI (direct liquid injection), with a vaporizor used to deliver the Sr precursor. The deposition chamber pressure ranges around 1.5 Torr, depending upon the gas flow rates. The dip tube side of the canister, containing the Sr precursor dissolved in a liquid (mesitylene), is connected to an injector valve in the DLI system, and pressurized $N_2$ (~30 psig) is connected to the other side of the canister to push the liquid. One cycle of CCVD of SrO consists of 5 steps.
1. Injection of a 0.1M solution of Sr precursor in mesitylene; opening an injection valve for a few milliseconds will provide Sr precursor containing vapor in the vaporizor;
2. Sr pulse: introducing Sr precursor vapor to the deposition chamber; and Sr precursor is chemically sorbed on the heated substrate;
3. Ar purge: purging away any unsorbed Sr precursor with Ar;
4. $O_2$ plasma pulse: introducing $O_2$ into the deposition chamber while applying radio frequency (RF) power (50 Watts (W) in this case) to react with sorbed Sr precursor on the heated substrate; and,
5. Ar purge: purging away any unreacted $O_2$ and by-products with Ar.

In this example, SrO film was obtained, showing a deposition temperature dependence of the SrO film. The injection time was 2 milliseconds, the Sr pulse time was 5 seconds, the Ar purge time after Sr pulse was 10 seconds, the $O_2$ plasma pulse time was 3 seconds, and the Ar purge time after $O_2$ plasma pulse was 10 seconds. Repeat for 150 cycles.

Figure 3:
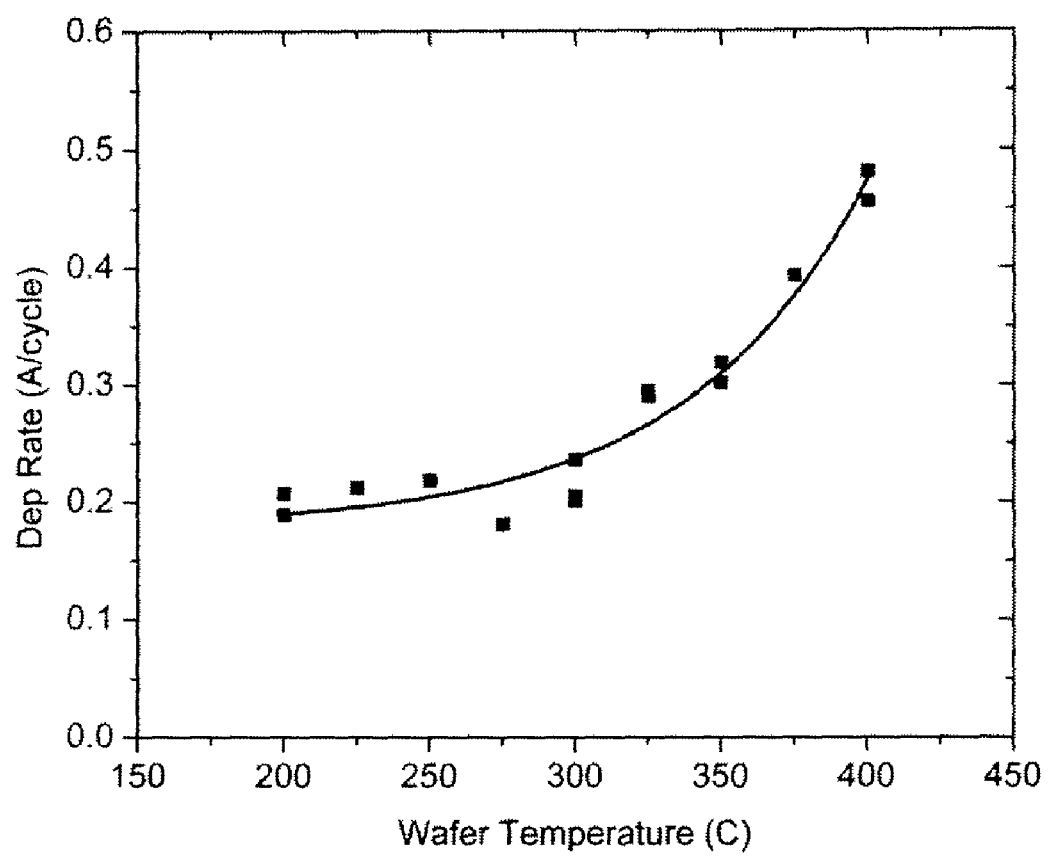
FIG. 3 is temperature dependence of PEALD of depositing SrO using $Sr\{^tBuC(O)CHC(NCH_2CH_2NMe_2)Me\}_2$ and $O_2$ plasma.

The results are depicted in FIG. 3, in which the ALD process window was up to ~320° C.

EXAMPLE 2

Figure 4:
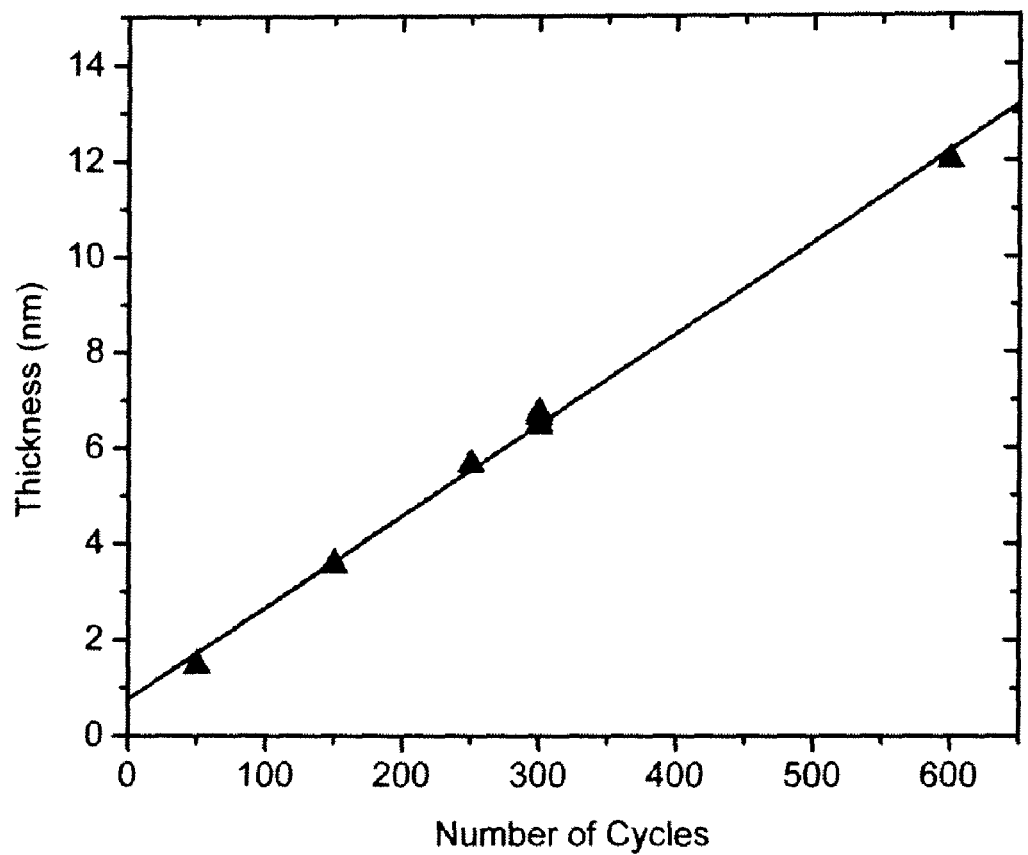
FIG. 4 shows the resulting SrO thickness dependence with the number of deposition cycles at a temperature of 250° C. via PEALD using $Sr\{^tBuC(O)CHC(NCH_2CH_2NMe_2)Me\}_2$ and $O_2$ plasma.

In this example, SrO films were deposited, via conditions as follows: the injection time of 0.1M solution of Sr precursor, $Sr\{^tBuC(O)CHC(NCH_2CH_2NMe_2)Me\}_2$, in mesitylene was 2 milliseconds, the Sr precursor pulse time was 5 seconds, the Ar purge time after Sr pulse was 10 seconds, the $O_2$ plasma pulse time was 3 seconds, and the Ar purge time after $O_2$ plasma pulse was 10 seconds. The wafer temperature is 250° C. The experiments were conducted for 50, 150, 250, 300, and 600 cycles respectively. The results are depicted in FIG. 4, showing a linear dependence of film thickness vs number of cycles, a characteristic feature of ALD processes.

EXAMPLE 3

Figure 5:
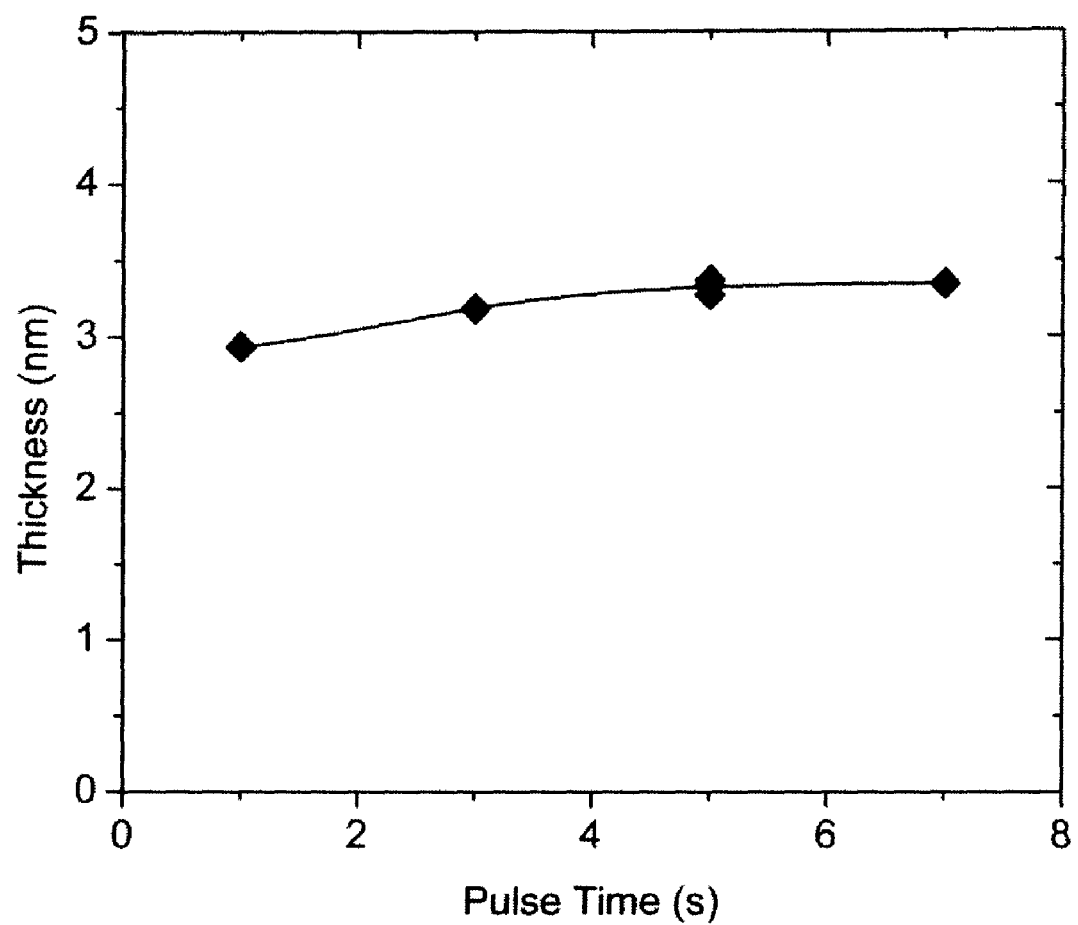
FIG. 5 shows the resulting SrO thickness dependence with the Sr precursor $Sr\{^tBuC(O)CHC(NCH_2CH_2NMe_2)Me\}_2$ pulse time at 250° C. via PEALD.

In this example, SrO films were deposited via conditions as follows: the injection time of 0.1M solution of Sr precursor, $Sr\{^tBuC(O)CHC(NCH_2CH_2NMe_2)Me\}_2$, in mesitylene was 2 milliseconds, the Ar purge time after Sr precursor pulse was 10 seconds, the $O_2$ plasma pulse time was 3 seconds, and the Ar purge time after $O_2$ plasma pulse was 10 seconds. The wafer temperature is 250° C. The Sr pulse time varies from 1 to 7 seconds. The results are depicted in FIG. 5, showing a saturation curve around 5 seconds for the Sr pulse, suggesting a typical self-limiting ALD process under these conditions.

EXAMPLE 4

This example describes an ALD or CCVD deposition of SrO using a Sr ketoiminate precursor, $Sr\{^tBuC(O)CHC(NCH_2CH_2NMe_2)Me\}_2$, dissolved in mesitylene and ozone. The deposition temperature range is 200~425° C., and a DLI (direct liquid injection), with a vaporizor used to deliver the Sr precursor. The deposition chamber pressure ranges around 1.5 Torr, depending upon the gas flow rates. The dip tube side of the canister, containing the Sr precursor dissolved in a liquid (mesitylene), is connected to an injector valve in the DLI system, and pressurized $N_2$ (~30 psig) is connected to the other side of the canister to push the liquid. One cycle of CCVD of SrO consists of 5 steps.
1. Injection of a 0.1M solution of Sr precursor in mesitylene; opening an injection valve for a few milliseconds will provide Sr precursor containing vapor in the vaporizor;
2. Sr pulse: introducing Sr precursor vapor to the deposition chamber; and Sr precursor is chemically sorbed on the heated substrate;
3. Ar purge: purging away any unsorbed Sr precursor with Ar;
4. Ozone pulse: introducing ozone into the deposition chamber; and,
5. Ar purge: purging away any unreacted ozone and any by-products with Ar.

In this example, SrO film was obtained, showing a deposition temperature dependence of the resulting SrO film deposition rates. The injection time was 2 milliseconds, the Sr pulse time was 5 seconds, the Ar purge time after Sr pulse was 10 seconds, the ozone pulse time was 5 seconds, and the Ar purge time after ozone pulse was 10 seconds.

Figure 6:
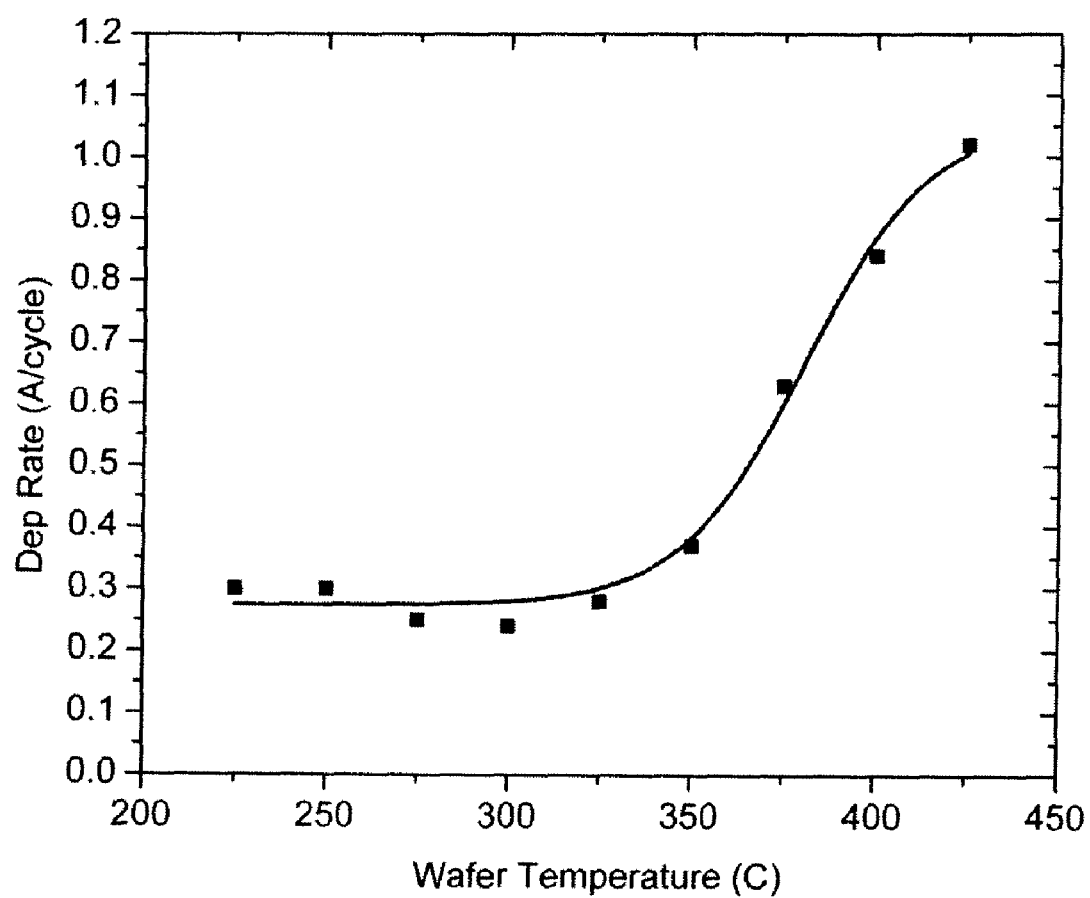
FIG. 6 is temperature dependence of thermal ALD of depositing SrO using $Sr\{^tBuC(O)CHC(NCH_2CH_2NMe_2)Me\}_2$ and ozone.

The results are depicted in FIG. 6 in which the ALD process window was up to ~340° C.

EXAMPLE 5

This example describes an ALD or CCVD deposition of SrO using a Sr ketoiminate precursor, $Sr\{^tBuC(O)CHC(NCH(Me)CH_2NMe_2)Me\}_2$, dissolved in 10% (wt) of THF in dodecane and ozone. The deposition temperature range is 200~425° C., and a commercial DLI (direct liquid injection) system was used to deliver the Sr precursor. The deposition chamber pressure ranges around 1.5 Torr, depending upon the gas flow rates. The dip tube side of the canister, containing the Sr precursor dissolved in 10% (wt) of THF in dodecane, is connected to an injector valve in the DLI system, and pressurized $N_2$ (~30 psig) is connected to the other side of the canister to push the liquid. In this case the injector valve is always open, and the liquid mixture of Sr precursor and above solvent is vaporized through a nozzle (atomizer). Ar carrier gas helps vaporization. One cycle of ALD or CCVD of SrO consists of 4 steps.

1. Injection of a 0.1M solution of $Sr\{^tBuC(O)CHC(NCH(Me)CH_2NMe_2)Me\}_2$ in 10% (wt) of THF in dodecane to deliver the Sr precursor vapors to the deposition chamber; and the Sr precursor is chemically sorbed on the heated substrate;
2. Ar purge: purging away any unsorbed Sr precursor with Ar;
3. ozone pulse: introducing ozone into the deposition chamber; and,
4. Ar purge: purging away any unreacted ozone and any by-products with Ar.

In this example, SrO film was obtained, showing a deposition temperature dependence of the resulting SrO film thickness. The injection time of the Sr pulse time was 5 seconds, the Ar purge time after Sr pulse was 5 seconds, the ozone pulse time was 5 seconds, and the Ar purge time after ozone pulse was 5 seconds.

Figure 7:
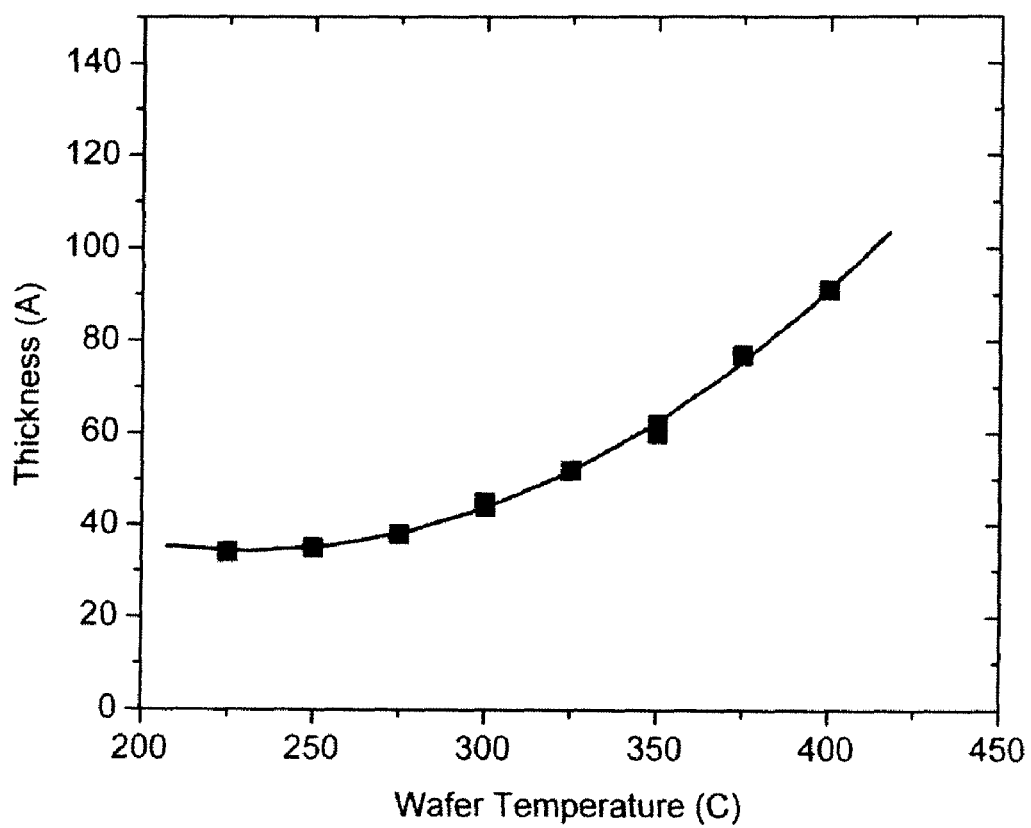
FIG. 7 is temperature dependence of thermal ALD of depositing SrO using $Sr\{^tBuC(O)CHC(NCH(Me)CH_2NMe_2)Me\}_2$ and ozone.

The results are depicted in FIG. 7 in which the ALD process window was up to ~320° C.

EXAMPLE 6

In this example, a direct liquid injection vaporizer system was monitored as strontium precursor, $Sr\{^tBuC(O)CHC(NCH_2CH_2NMe_2)Me\}_2$, dissolved in solvent was vaporized through the heated injector. In this case, the injector was heated to 185° C., the carrier gas flow rate was 500 sccm of helium gas, a precursor-solvent mass flow rate of 1 g/min. The pressure monitor was located prior to the injector, directly in the carrier gas stream.

Figure 8:
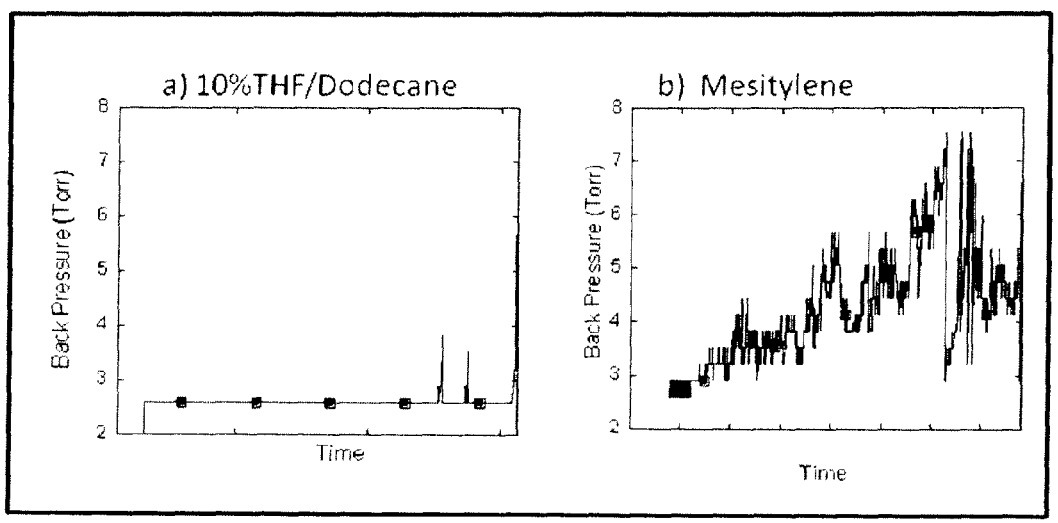
FIG. 8 is demonstration of direct liquid injection stability through back pressure monitoring prior to the injector orifice. A) 0.1 M strontium precursor $Sr\{^tBuC(O)CHC(NCH(Me)CH_2NMe_2)Me\}_2$ dissolved in mesitylene and B) 0.1M strontium precursor $Sr\{^tBuC(O)CHC(NCH(Me)CH_2NMe_2)Me\}_2$ dissolved in 10% (wt) tetrahydrofuran in dodecane.

The results in FIG. 8 show a very stable back pressure over the run time of ~3 hours using a combined solvent of 10% (wt) of THF in dodecane. In contrast, the same concentration of strontium precursor dissolved in mesitylene shows a continual increase in back pressure as additional precursor was flowing through the injector system. The combined effect of the higher boiling point solvent of dodecane with the additional solubility gained through addition of THF enabled stable injector performance over the lifetime of this flow test.

The invention claimed is:

1. In a cyclic deposition process for the formation of ternary metal oxide films wherein a plurality of precursors are sequentially introduced into a deposition chamber, vaporized and deposited on a substrate under conditions for forming said ternary metal oxide film, the improvement which comprises:
employing a first metal ketoiminate as a first precursor;
employing an oxygen-containing source;
employing a second metal ketoiminate as a second and different precursor; and,
employing an oxygen-containing source, wherein one of the first or second ketoiminates is selected from the group represented by structure A:

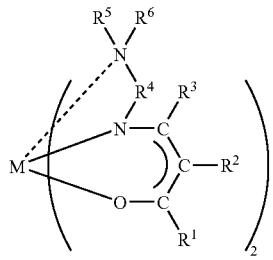

wherein M is a divalent Group 2 metal selected from the group consisting of calcium, magnesium, strontium, and barium; wherein $R^1$ is selected from the group consisting of alkyl, fluoroalkyl, cycloaliphatic, having from 1 to 10 carbon atoms, and aryl having from 6 to 12 carbon atoms; $R^2$ is selected from the group consisting of hydrogen, alkyl, alkoxy, cycloaliphatic, having from 1 to 10 carbon atoms, and aryl having 6 to 12 carbon atoms; $R^3$ is selected from the group consisting of alkyl, fluoroalkyl, cycloaliphatic, having from 1 to 10 carbon atoms, and aryl having 6 to 12 carbon atoms; $R^4$ is a $C_{2-3}$ linear or branched alkylene bridge with or without chiral carbon atom, thus making a five- or six-membered coordinating ring to the metal center; $R^{5-6}$ are individually selected from the group consisting of alkyl, fluoroalkyl, cycloaliphatic, having from 1 to 10 carbon atoms, and aryl having 6 to 12 carbon atoms, and they can be connected to form a ring containing carbon, oxygen, or nitrogen atoms; and the other of the first or second ketoiminate is selected from a group represented by structure B:

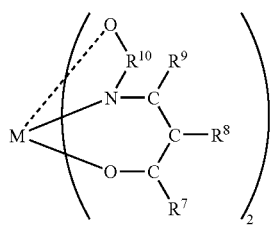

wherein M is a tetra-valent metals selected from the group consisting of titanium, zirconium, and hafnium; wherein $R^7$ is selected from the group consisting of alkyl, fluoroalkyl, cycloaliphatic, having from 1 to 10 carbon atoms, and aryl having 6 to 12 carbon atoms; $R^{8-9}$ is selected from the group consisting of hydrogen, alkyl, alkoxy, cycloaliphatic, having from 1 to 10 carbon atoms, and aryl having 6 to 12 carbon atoms; $R^{10}$ is a $C_{2-3}$ linear or branched alkylene bridge with or without chiral carbon atom, thus making a five- or six-membered coordinating ring to the metal center.

2. The process of claim 1 wherein the metal ketoiminates are delivered via direct liquid delivery by dissolving the ketoiminates in a solvent or a solvent mixture to prepare a solution with a molar concentration from 0.01 to 2 M.

3. The process of claim 1 wherein the solvent is selected from the group consisting of aliphatic hydrocarbons, aromatic hydrocarbons, linear or cyclic ethers, esters, nitriles, alcohols, amines, polyamines, organic amides and mixtures thereof.

4. The process of claim 3 where the solvent is selected from group consisting of tetrahydrofuran (THF), mesitylene, dodecane, N-methylpyrrolidinone (NMP), and mixtures thereof.

5. The process of claim 1 where the ternary metal oxide is strontium titanate.

6. The process of claim 1 wherein the cyclic deposition process is a cyclic chemical vapor deposition process.

7. The process of claim 1 wherein the cyclic deposition process is an atomic layer deposition process.

8. The process of claim 1 wherein the pressure in the deposition chamber is from 50 mtorr to 100 torr and the temperature in said deposition chamber is below 500° C.

9. The process of claim 1 wherein the oxygen-containing source is selected from the group consisting of oxygen, oxygen plasma, water, water plasma, ozone, nitrous oxide and mixtures thereof.

10. The process of claim 1 wherein the resulting ternary metal oxide film is exposed to a rapid thermal annealing or plasma treatment to densify the resulting multicomponent metal oxide film.

11. The process of claim 1 wherein the metal ketoiminate of the structure A is selected from the group consisting of Sr{$^t$BuC(O)CHC(NCH$_2$CH$_2$NMe$_2$)Me}$_2$, Sr{$^t$BuC(O)CHC(NCH$_2$CH$_2$NEt$_2$)Me}$_2$, Sr{$^t$BuC(O)CHC(NCH(Me)CH$_2$NMe$_2$)Me}$_2$, and Sr{$^t$BuC(O)CHC(NCH(Me)CH$_2$NEt$_2$)Me}$_2$; the structure B metal ketoiminate is selected from the group consisting of Ti{MeC(O)CHC(NCH$_2$CH$_2$O)Me}$_2$ and Ti{MeC(O)CHC(NCH(Me)CH$_2$O)Me}$_2$.

12. The process of claim 1 wherein $R^1$ is selected from the group consisting of alkyl, fluoroalkyl, cycloaliphatic, having from 1 to 6 carbon atoms.

13. The process of claim 1 wherein $R^2$ is selected from the group consisting of hydrogen, alkyl, alkoxy, cycloaliphatic, having from 1 to 6 carbon atoms.

14. The process of claim 1 wherein $R^3$ is selected from the group consisting of alkyl, fluoroalkyl, cycloaliphatic, having from 1 to 6 carbon atoms.

15. The process of claim 1 wherein $R^{5-6}$ are individually selected from the group consisting of alkyl, fluoroalkyl, cycloaliphatic, having from 1 to 6 carbon atoms.

16. The process of claim 1 wherein $R^7$ is selected from the group consisting of alkyl, fluoroalkyl, cycloaliphatic, having from 1 to 6 carbon atoms.

17. The process of claim 1 wherein $R^{8-9}$ is selected from the group consisting of hydrogen, alkyl, alkoxy, cycloaliphatic, having from 1 to 6 carbon atoms.

18. In a cyclic deposition process for the formation of multiple component metal oxide films wherein a plurality of precursors are introduced into a deposition chamber, vaporized and deposited on a substrate under conditions for forming said multiple component metal oxide film, the improvement which comprises:
   employing at least two metal ketoiminates dissolved in a solvent or a solvent mixture to prepare a solution; and
   employing an oxygen-containing source, wherein the at least two metal ketoiminates comprise a metal ketoiminate represented by structure A and another metal ketoiminate represented by structure B, the solutions each has a molar concentration from 0.01 to 2 M;

wherein the structures A and B are defined below:

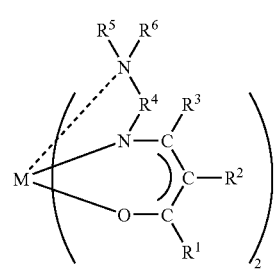

A wherein M is a divalent Group 2 metal selected from the group consisting of calcium, magnesium, strontium, and barium; wherein $R^1$ is selected from the group consisting of alkyl, fluoroalkyl, cycloaliphatic, having from 1 to 10 carbon atoms, and aryl having 6 to 12 carbon atoms; $R^2$ is selected from the group consisting of hydrogen, alkyl, alkoxy, cycloaliphatic, having from 1 to 10 carbon atoms, and aryl having 6 to 12 carbon atoms; $R^3$ is selected from the group consisting of alkyl, fluoroalkyl, cycloaliphatic, having from 1 to 10 carbon atoms, and aryl having 6 to 12 carbon atoms; $R^4$ is a $C_{2-3}$ linear or branched alkylene bridge with or without chiral carbon atom, thus making a five- or six-membered coordinating ring to the metal center; $R^{5-6}$ are individually selected from the group consisting of alkyl, fluoroalkyl, cycloaliphatic, having from 1 to 10 carbon atoms, and aryl having 6 to 12 carbon atoms, and they can be connected to form a ring containing carbon, oxygen, or nitrogen atoms;

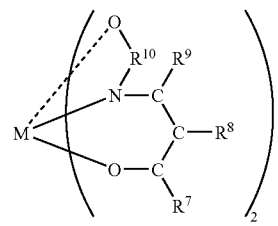

B wherein M is a tetra-valent metals selected from the group consisting of titanium, zirconium, and hafnium; wherein $R^7$ is selected from the group consisting of alkyl, fluoroalkvl, cycloaliphatic, having from 1 to 10 carbon atoms, and aryl having 6 to 12 carbon atoms; $R^{8-9}$ is selected from the group consisting of hydrogen, alkyl, alkoxv, cycloaliphatic, having from 1 to 10 carbon atoms, and aryl having 6 to 12 carbon atoms; $R^{10}$ is a $C_{2-3}$ linear or branched alkylene bridge with or without chiral carbon atom, thus making a five- or six-membered coordinating ring to the metal center.

19. The process of claim 18 wherein the solution of metal ketoiminates is delivered via direct liquid injection.

20. The process of claim 18 wherein the solvent is selected from the group consisting of aliphatic hydrocarbons, aromatic hydrocarbons, linear or cyclic ethers, esters, nitriles, alcohols, amines, polyamines, organic amides and mixtures thereof.

21. The process of claim 20 where the solvent is selected from group consisting of tetrahydrofuran (THF), mesitylene, dodecane, N-methylpyrrolidinone (NMP) and their mixture thereof.

22. The process of claim 18 where the multiple component metal oxide is strontium titanate.

23. The process of claim 18 wherein the cyclic deposition process is a cyclic chemical vapor deposition process.

24. The process of claim 18 wherein the structure A metal ketoiminate is selected from the group consisting of Sr{$^t$BuC(O)CHC(NCH$_2$CH$_2$NMe$_2$)Me}$_2$, Sr{$^t$BuC(O)CHC(NCH$_2$CH$_2$NEt$_2$)Me}$_2$, Sr{$^t$BuC(O)CHC(NCH(Me)CH$_2$NMe$_2$)Me}$_2$, and Sr{$^t$BuC(O)CHC(NCH(Me)CH$_2$NEt$_2$)Me}$_2$.

25. The process of claim 18 wherein the structure B metal ketoiminate is selected from the group consisting of Ti{MeC(O)CHC(NCH$_2$CH$_2$O)Me}$_2$ and Ti{MeC(O)CHC(NCH(Me)CH$_2$O)Me}$_2$.

26. The process of claim 18 wherein $R^1$ is selected from the group consisting of alkyl, fluoroalkyl, cycloaliphatic, having from 1 to 6 carbon atoms.

27. The process of claim 18 wherein $R^2$ is selected from the group consisting of hydrogen, alkyl, alkoxy, cycloaliphatic, having from 1 to 6 carbon atoms.

28. The process of claim 18 wherein $R^3$ is selected from the group consisting of alkyl, fluoroalkyl, cycloaliphatic, having from 1 to 6 carbon atoms.

29. The process of claim 18 wherein $R^{5-6}$ are individually selected from the group consisting of alkyl, fluoroalkyl, cycloaliphatic, having from 1 to 6 carbon atoms.

30. The process of claim 18 wherein $R^7$ is selected from the group consisting of alkyl, fluoroalkyl, cycloaliphatic, having from 1 to 6 carbon atoms.

31. The process of claim 18 wherein $R^{8-9}$ is selected from the group consisting of hydrogen, alkyl, alkoxy, cycloaliphatic, having from 1 to 6 carbon atoms.

* * * * *

UNITED STATES PATENT AND TRADEMARK OFFICE
CERTIFICATE OF CORRECTION

PATENT NO. : 8,092,870 B2  
APPLICATION NO. : 12/410529  
DATED : January 10, 2012  
INVENTOR(S) : Moo-Sung Kim et al.

Page 1 of 1

It is certified that error appears in the above-identified patent and that said Letters Patent is hereby corrected as shown below:

In the Claims:

Column 8, Line 24

In Claim 1 delete "fluoroalkvl," and insert -- fluoroalkyl, --

Column 8, Line 55

In Claim 1 delete "alkoxv," and insert -- alkoxy, --

Column 10, Line 48

In Claim 18 delete "fluoroalkvl," and insert -- fluoroalkyl, --

Column 10, Line 51

In Claim 18 delete "alkoxv," and insert -- alkoxy, --

Signed and Sealed this
Twenty-third Day of April, 2013

Teresa Stanek Rea
*Acting Director of the United States Patent and Trademark Office*